(12) United States Patent
Taguchi

(10) Patent No.: US 12,255,092 B2
(45) Date of Patent: Mar. 18, 2025

(54) SUBSTRATE PROCESSING APPARATUS

(71) Applicant: Tokyo Electron Limited, Tokyo (JP)

(72) Inventor: Junnosuke Taguchi, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 315 days.

(21) Appl. No.: 17/502,615

(22) Filed: Oct. 15, 2021

(65) Prior Publication Data

US 2022/0130712 A1 Apr. 28, 2022

(30) Foreign Application Priority Data

Oct. 28, 2020 (JP) ................... 2020-180260

(51) Int. Cl.
*H01L 21/68* (2006.01)
*H01L 21/67* (2006.01)
*H01L 21/687* (2006.01)

(52) U.S. Cl.
CPC .. *H01L 21/68764* (2013.01); *H01L 21/67103* (2013.01); *H01L 21/68728* (2013.01)

(58) Field of Classification Search
CPC ......... H01L 21/67103; H01L 21/68728; H01L 21/68764; H01L 21/68771; H01L 21/68792
See application file for complete search history.

(56) References Cited

U.S. PATENT DOCUMENTS

| 3,783,822 | A | * | 1/1974 | Wollam | ................. C30B 25/08 118/725 |
| 5,267,607 | A | * | 12/1993 | Wada | ................ H01L 21/68728 118/724 |
| 2015/0099065 | A1 | * | 4/2015 | Canizares | ......... C23C 16/45591 427/255.28 |
| 2015/0243507 | A1 | * | 8/2015 | Harada | ............. H01L 21/28568 118/696 |
| 2016/0122872 | A1 | * | 5/2016 | Kato | ................. H01L 21/68764 118/712 |
| 2016/0138159 | A1 | * | 5/2016 | Kato | ................... C23C 16/4408 118/730 |
| 2021/0032771 | A1 | * | 2/2021 | Bastke | .................... C30B 25/12 |

FOREIGN PATENT DOCUMENTS

| JP | 2019-106481 A | 6/2019 |
| JP | 2020-119921 A | 8/2020 |

* cited by examiner

*Primary Examiner* — Matthew J Song
(74) *Attorney, Agent, or Firm* — Venjuris, P.C.

(57) ABSTRACT

A substrate processing apparatus includes: a rotary table provided inside a processing container; a stage provided on an upper surface of the rotary table in order to mount a substrate thereon, and configured to revolve by a rotation of the rotary table; a heater configured to heat the substrate mounted on the stage; and a rotation shaft provided at a location that rotates together with the rotary table to freely rotate while supporting the stage, and including a low heat conductivity body formed of a material with a heat conductivity lower than that of the stage.

13 Claims, 12 Drawing Sheets

US 12,255,092 B2

SUBSTRATE PROCESSING APPARATUS

CROSS-REFERENCE TO RELATED APPLICATIONS

This application is based on and claims priority from Japanese Patent Application No. 2020-180260 filed on Oct. 28, 2020 with the Japan Patent Office, the disclosure of which is incorporated herein in its entirety by reference.

TECHNICAL FIELD

The present disclosure relates to a substrate processing apparatus.

BACKGROUND

An apparatus is known which rotates a rotary table with a plurality of wafers mounted thereon to revolve each wafer, and allows the wafers to repeatedly pass through processing gas supply regions arranged along the radial direction of the rotary table, thereby forming various types of films on the wafers (see, e.g., Japanese Patent Laid-Patent Publication No. 2020-119921). In this apparatus, while the wafer is revolved by the rotary table, a stage of the wafer is rotated such that the wafer rotates, thereby improving the uniformity of a film in the circumferential direction of the wafer.

SUMMARY

According to an aspect of the present disclosure, a substrate processing apparatus includes: a rotary table provided inside a processing container; a stage provided on an upper surface of the rotary table in order to mount a substrate thereon, and configured to revolve by a rotation of the rotary table; a heater configured to heat the substrate mounted on the stage; and a rotation shaft provided at a location that rotates together with the rotary table to freely rotate while supporting the stage, and including a low heat conductivity body formed of a material with a heat conductivity lower than that of the stage.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
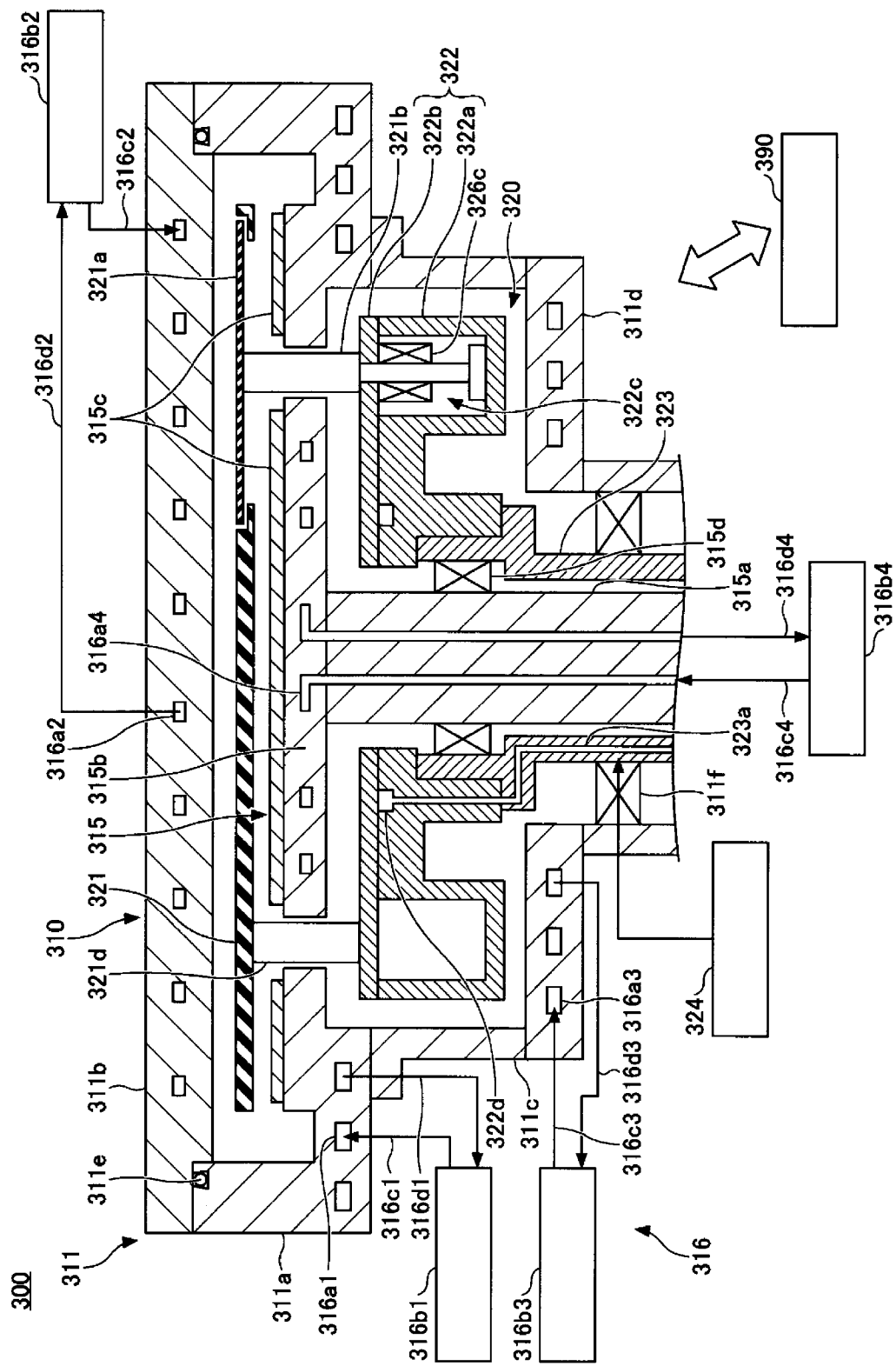
FIG. 1 is a cross-sectional view illustrating an example of a configuration of a film forming apparatus.

In the following detailed description, reference is made to the accompanying drawings which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, a non-limiting embodiment of the present disclosure will be described with reference to the accompanying drawings. In all of the drawings, the same or corresponding members or parts will be denoted by the same or corresponding reference numerals, and overlapping descriptions thereof will be omitted.

[Substrate Processing Apparatus]

With reference to FIGS. 1 to 4, a film forming apparatus 300 that forms a film on a substrate will be described as an example of a substrate processing apparatus.

Figure 2:
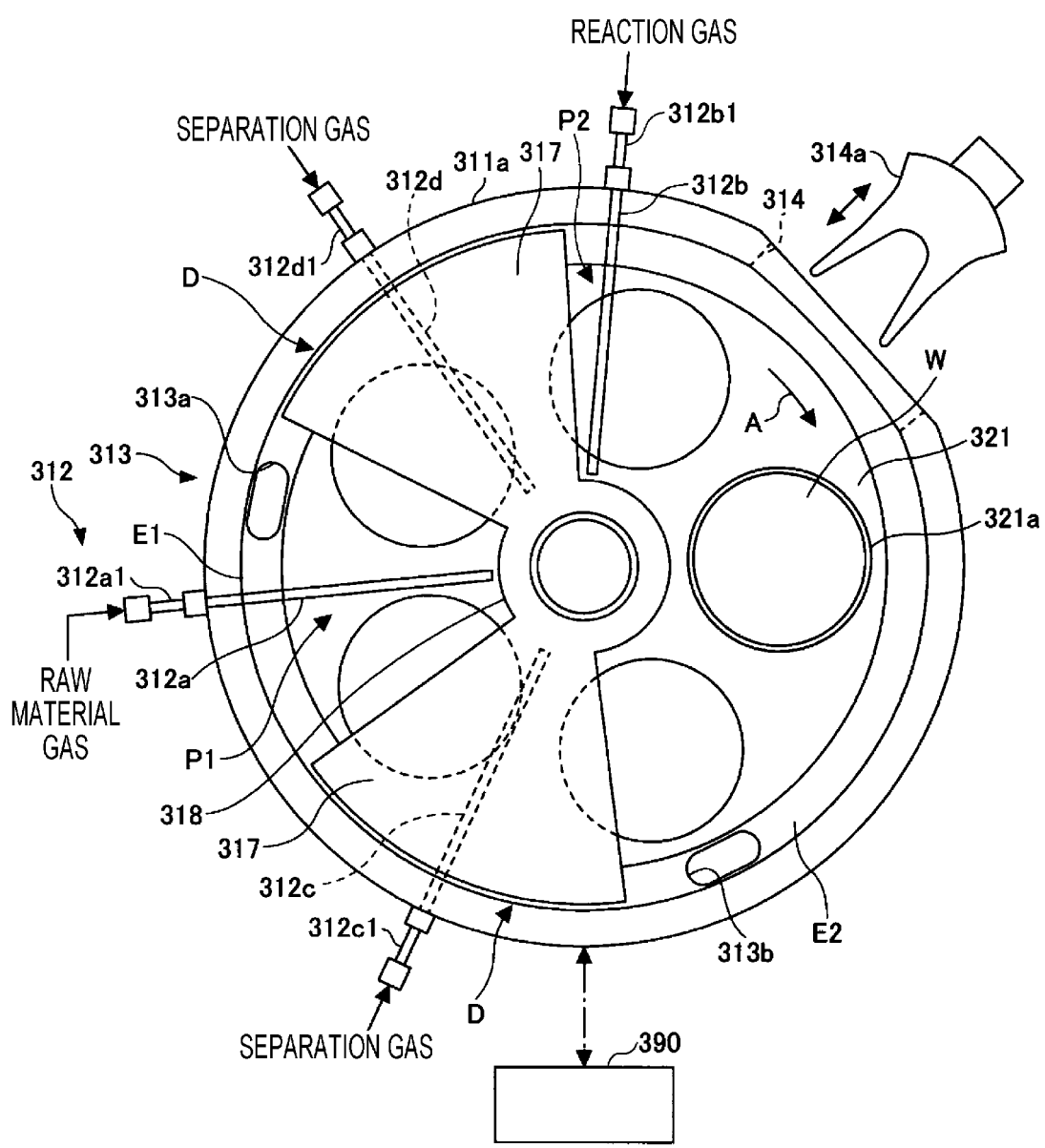
FIG. 2 is a plan view illustrating an internal configuration of a vacuum container of the film forming apparatus of FIG. 1.
Figure 3:
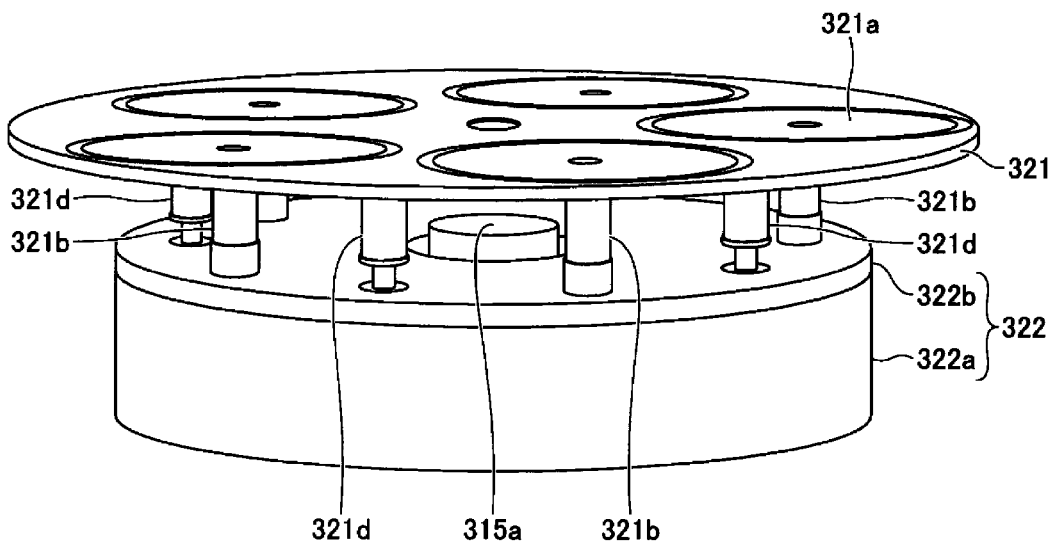
FIG. 3 is a perspective view illustrating a configuration of a rotary table and a stage of the film forming apparatus of FIG. 1.
Figure 4:
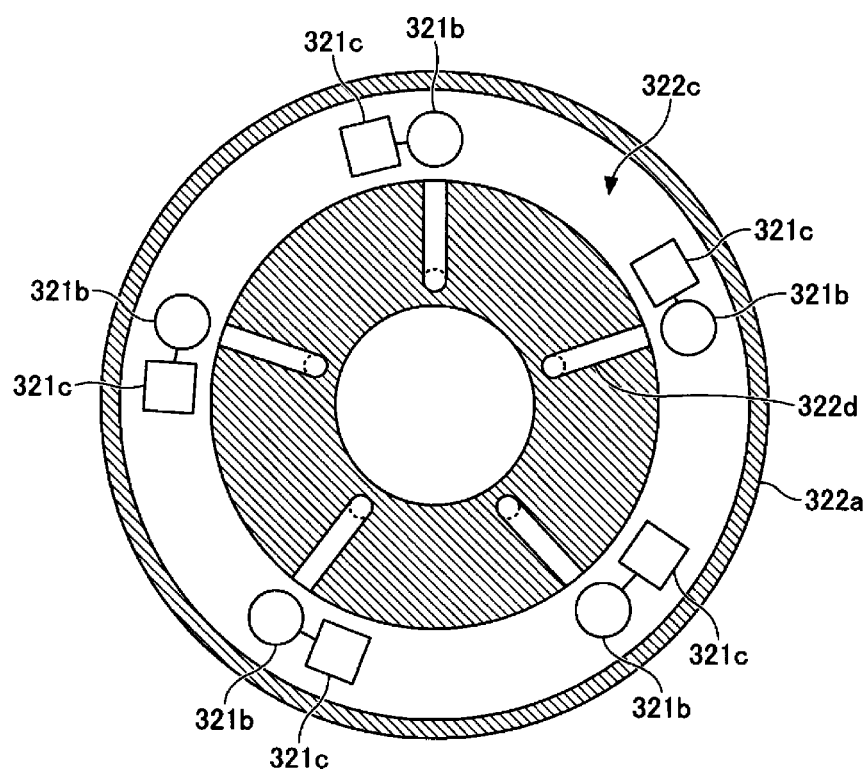
FIG. 4 is a cross-sectional view illustrating an internal configuration of an accommodation box of the film forming apparatus of FIG. 1.

FIG. 1 is a cross-sectional view illustrating an example of a configuration of the film forming apparatus. FIG. 2 is a plan view illustrating an internal configuration of a vacuum container of the film forming apparatus of FIG. 1. For the convenience of descriptions, FIG. 2 omits the illustration of a ceiling plate. FIG. 3 is a perspective view illustrating a configuration of a rotary table and a stage of the film forming apparatus of FIG. 1. FIG. 4 is a cross-sectional view illustrating an internal configuration of an accommodation box of the film forming apparatus of FIG. 1.

The film forming apparatus 300 includes a processing unit 310, a rotation driving device 320, and a controller 390.

The processing unit 310 is configured to execute a film forming process for forming a film on a substrate. The processing unit 310 includes a vacuum container 311, a gas introduction port 312, a gas exhaust port 313, a transfer port 314, a heating unit 315, and a cooling unit 316.

The vacuum container 311 is a processing container capable of reducing the internal pressure thereof. The vacuum container 311 has a flat shape with a substantially circular planar shape, and accommodates a plurality of substrates W therein. The substrates W may be, for example, semiconductor wafers. The vacuum container 311 includes a main body 311*a*, a ceiling plate 311*b*, a side wall body 311*c*, and a bottom plate 311*d* (FIG. 1). The main body 311*a* has a cylindrical shape. The ceiling plate 311*b* is airtightly and detachably disposed on the upper surface of the main body 311*a* via a seal unit 311*e*. The side wall body 311*c* is connected to the lower surface of the main body 311*a* and has a cylindrical shape. The bottom plate 311d is airtightly disposed on the bottom surface of the side wall body 311c.

The gas introduction port 312 includes a raw material gas nozzle 312a, a reaction gas nozzle 312b, and separation gas nozzles 312c and 312d (FIG. 2). The raw material gas nozzle 312a, the reaction gas nozzle 312b, and the separation gas nozzles 312c and 312d are arranged above a rotary table 321 in the circumferential direction of the vacuum container 311 (the direction indicated by the arrow A in FIG. 2) at intervals. In the illustrated example, the separation gas nozzle 312c, the raw material gas nozzle 312a, the separation gas nozzle 312d, and the reaction gas nozzle 312b are arranged in this order in the clockwise direction (the rotation direction of the rotary table 321) from the transfer port 314. Gas introduction ports 312a1, 312b1, 312c1, and 312d1 (FIG. 2) which are the base ends of the raw material gas nozzle 312a, the reaction gas nozzle 312b, and the separation gas nozzles 312c and 312d are fixed to the outer wall of the main body 311a. Then, the raw material gas nozzle 312a, the reaction gas nozzle 312b, and the separation gas nozzles 312c and 312d are introduced into the vacuum container 311 from the outer wall of the vacuum container 311, and attached to extend horizontally with respect to the rotary table 321 along the radial direction of the main body 311a. The raw material gas nozzle 312a, the reaction gas nozzle 312b, and the separation gas nozzles 312c and 312d are formed of, for example, quartz.

The raw material gas nozzle 312a is connected to a supply source (not illustrated) of a raw material gas via, for example, a pipe or a flow rate controller (not illustrated). As for the raw material gas, for example, a silicon-containing gas and a metal-containing gas may be used. In the raw material gas nozzle 312a, a plurality of ejection holes (not illustrated) is formed to be opened toward the rotary table 321 and arranged at intervals along the length direction of the raw material gas nozzle 312a. The region under the raw material gas nozzle 312a becomes a raw material gas adsorption region P1 where the raw material gas is adsorbed to a substrate W.

The reaction gas nozzle 312b is connected to a supply source (not illustrated) of a reaction gas via, for example, a pipe and a flow rate controller (not illustrated). As for the reaction gas, for example, an oxidizing gas or a nitriding gas may be used. In the reaction gas nozzle 312b, a plurality of ejection holes (not illustrated) is formed to be opened toward the rotary table 321 and arranged at intervals along the length direction of the reaction gas nozzle 312b. The region under the reaction gas nozzle 312b becomes a reaction gas supply region P2 where the raw material gas adsorbed to the substrate W in the raw material gas adsorption region P1 is oxidized or nitrided.

The separation gas nozzles 312c and 312d are each connected to a supply source (not illustrated) of a separation gas via, for example, a pipe or a flow rate controller (not illustrated). As for the separation gas, an inert gas such as argon (Ar) gas or nitrogen ($N_2$) gas may be used. In each of the separation gas nozzles 312c and 312d, a plurality of ejection holes (not illustrated) is formed to be opened toward the rotary table 321 and arranged at intervals along the length direction of each of the separation gas nozzles 312c and 312d.

Further, as illustrated in FIG. 2, two convex portions 4 are formed in the vacuum container 311. The convex portions 317 are attached to the back surface of the ceiling plate 311b to project toward the rotary table 2, in order to make up separation regions D together with the separation gas nozzles 312c and 312d. Each convex portion 317 has a fan planar shape cut in an arc shape at the top portion thereof, and is disposed such that the inner arc is connected to a protrusion 318, and the outer arc follows the inner wall of the main body 311a of the vacuum container 311.

The gas exhaust port 313 includes a first exhaust port 313a and a second exhaust port 313b (FIG. 2). The first exhaust port 313a is formed at the bottom of a first exhaust region E1 that communicates with the raw material gas adsorption region P1. The second exhaust port 313b is formed at the bottom of a second exhaust region E2 that communicates with the reaction gas supply region P2. The first exhaust port 313a and the second exhaust port 313b are connected to an exhaust device (not illustrated) via exhaust pipes (not illustrated).

The transfer port 314 is formed in the side wall of the vacuum container 1 (FIG. 2). Through the transfer port 314, the substrate W is transferred between the rotary table 321 inside the vacuum container 311 and a transfer arm 314a outside the vacuum container 311. The transfer port 314 is opened and closed by a gate valve (not illustrated).

The heating unit 315 includes a fixed shaft 315a, a heater support 315b, and a heater 315c (FIG. 1).

The fixed shaft 315a has a cylindrical shape of which central axis is the center of the vacuum container 311. The fixed shaft 315a is provided inside a rotary shaft 323 to penetrate the bottom plate 311d of the vacuum container 311. A seal unit 315d is provided between the outer wall of the fixed shaft 315a and the inner wall of the rotary shaft 323. Accordingly, the rotary shaft 323 rotates around the fixed shaft 315a while maintaining the airtight state inside the vacuum container 311. The seal unit 315d includes, for example, a magnetic fluid seal.

The heater support 315b is fixed to the upper portion of the fixed shaft 315a and has a disc shape. The heater support 315b supports the heater 315c.

The heater 315c is provided on the upper surface of the heater support 315b. The heater 315c may be provided on the main body 311a, in addition to the upper surface of the heater support 315b. When an electric power is supplied from a power source (not illustrated), the heater 315c generates heat and heats the substrate W.

The cooling unit 316 includes fluid flow paths 316a1 to 316a4, chiller units 316b1 to 316b4, inlet pipes 316c1 to 316c4, and outlet pipes 316d1 to 316d4. The fluid flow paths 316a1 to 316a4 are formed inside the main body 311a, the ceiling plate 311b, the bottom plate 311d, and the heater support 315b, respectively. The chiller units 316b1 to 316b4 output temperature adjustment fluids. The temperature adjustment fluids output from the chiller units 316b1 to 316b4 circulate by flowing through the inlet pipes 316c1 to 316c4, the fluid flow paths 316a1 to 316a4, and the outlet pipes 316d1 to 316d4 in this order. Accordingly, the temperatures of the main body 311a, the ceiling plate 311b, the bottom plate 311d, and the heater support 315b are adjusted. As for the temperature adjustment fluids, for example, water or a fluorine-based fluid such as Galden (registered trademark) may be used.

The rotation driving device 320 includes the rotary table 321, an accommodation box 322, the rotary shaft 323, and a revolution motor 324.

The rotary table 321 is provided inside the vacuum container 311, and has the rotation axis at the center of the vacuum container 311. The rotary table 321 has, for example, a disc shape and is formed of quartz. A plurality of (e.g., five) stages 321a is provided on the upper surface of the rotary table 321 along the rotation direction (circumferential direction) of the rotary table 321. The rotary table 321 is connected to the accommodation box 322 via a connection unit 321d.

Each stage 321a has a disc shape slightly larger than the substrate W, and is formed of, for example, quartz. The substrate W is mounted on each stage 321a. The substrate W may be, for example, a semiconductor wafer. Each stage 321a is connected to the rotation motor 321c via a rotation shaft 321b, and is configured to be rotatable with respect to the rotary table 321.

The rotation shaft 321b connects the lower surface of the stage 321a and the rotation motor 321c accommodated inside the accommodation box 322, and transmits the power of the rotation motor 321c to the stage 321a. The rotation shaft 321b is configured to be rotatable using the center of the stage 321a as the rotation axis thereof. The rotation shaft 321b is provided to penetrate the ceiling 322b of the accommodation box 322 and the rotary table 321. A seal unit 326c is provided in the through hole of the ceiling 322b of the accommodation box 322, so that the airtight state inside the accommodation box 322 is maintained. The seal unit 326c includes, for example, a magnetic fluid seal.

The rotation motor 321c rotates the stage 321a with respect to the rotary table 321 via the rotation shaft 321b, so as to rotate the substrate. The rotation motor 321c may be, for example, a servomotor.

The connection unit 321d connects, for example, the lower surface of the rotary table 321 and the upper surface of the accommodation box 322. A plurality of connection units 321d is provided along, for example, the circumferential direction of the rotary table 321.

The detailed structures of the rotary table 321 and the stage 321a, the rotation shaft 321b, and the connection unit 321d will be described later.

The accommodation box 322 is provided below the rotary table 321 inside the vacuum container 311. The accommodation box 322 is connected to the rotary table 321 via the connection unit 321d, and configured to be rotatable integrally with the rotary table 321. The accommodation box 322 may be configured to be able to move up and down in the vacuum container 311 by a lifting mechanism (not illustrated). The accommodation box 322 includes a main body 322a and a ceiling 322b.

The main body 322a is formed in a concave shape in a cross-sectional view, and formed in a ring shape along the rotation direction of the rotary table 321.

The ceiling 322b is provided on the upper surface of the main body 322a to cover the opening of the main body 322a formed in the concave shape in the cross-sectional view. Accordingly, the main body 322a and the ceiling 322b form an accommodation unit 322c isolated from the inside of the vacuum container 311.

The accommodation unit 322c is formed in a rectangular shape in a cross-sectional view, and formed in a ring shape along the rotation direction of the rotary table 321. The accommodation unit 322c accommodates the rotation motor 321c. In the main body 322a, a communication passage 322d is formed to communicate the accommodation unit 322c and the outside of the film forming apparatus 300 with each other. Accordingly, the atmosphere is introduced into the accommodation unit 322c from the outside of the film forming apparatus 300, so that the inside of the accommodation unit 322c is cooled and maintained at the atmospheric pressure.

The rotary shaft 323 is fixed to the lower portion of the accommodation box 322. The rotary shaft 323 is provided to penetrate the bottom plate 311d of the vacuum container 311. The rotary shaft 323 transmits the power of the revolution motor 324 to the rotary table 321 and the accommodation box 322, and rotates the rotary table 321 and the accommodation box 322 integrally. A seal unit 311f is provided in the through hole of the bottom plate 311d of the vacuum container 311, so that the airtight state inside the vacuum container 311 is maintained. The seal unit 311f includes, for example, a magnetic fluid seal.

A through hole 323a is formed inside the rotary shaft 323. The through hole 323a is connected to the communication passage 322d of the accommodation box 322, and functions as a fluid flow path for introducing the atmosphere into the accommodation box 322. The through hole 323a also functions as a wiring duct for introducing a power line and a signal line for driving the rotation motor 321c in the accommodation box 322. The through hole 323a is formed as many as the number of, for example, the rotation motors 321c.

The controller 390 controls each unit of the film forming apparatus 300. The controller 390 may be, for example, a computer. A storage medium stores a computer program for performing the operation of each unit of the film forming apparatus 300. The storage medium may be, for example, a flexible disc, a compact disc, a hard disc, a flash memory, a DVD or the like.

[Fixing Mechanism of Stage]

Figure 5A:
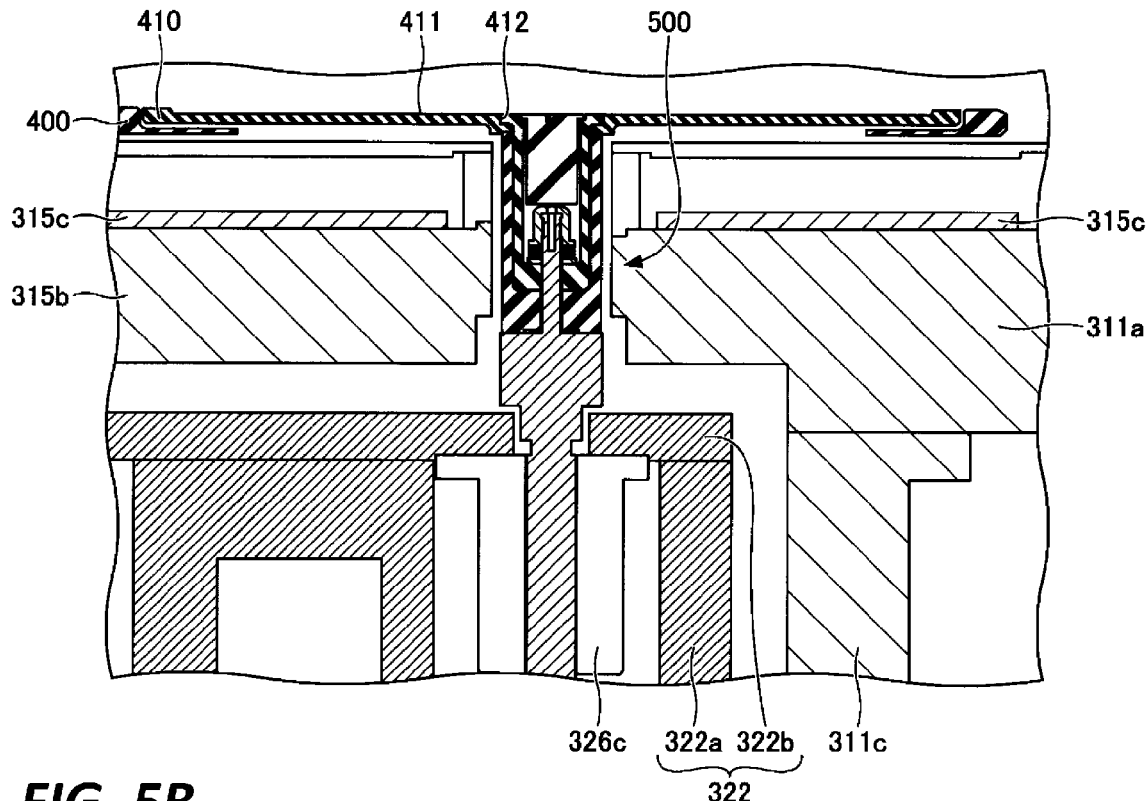
FIGS. 5A and 5B are views illustrating an example of a mechanism that fixes the stage.
Figure 5B:
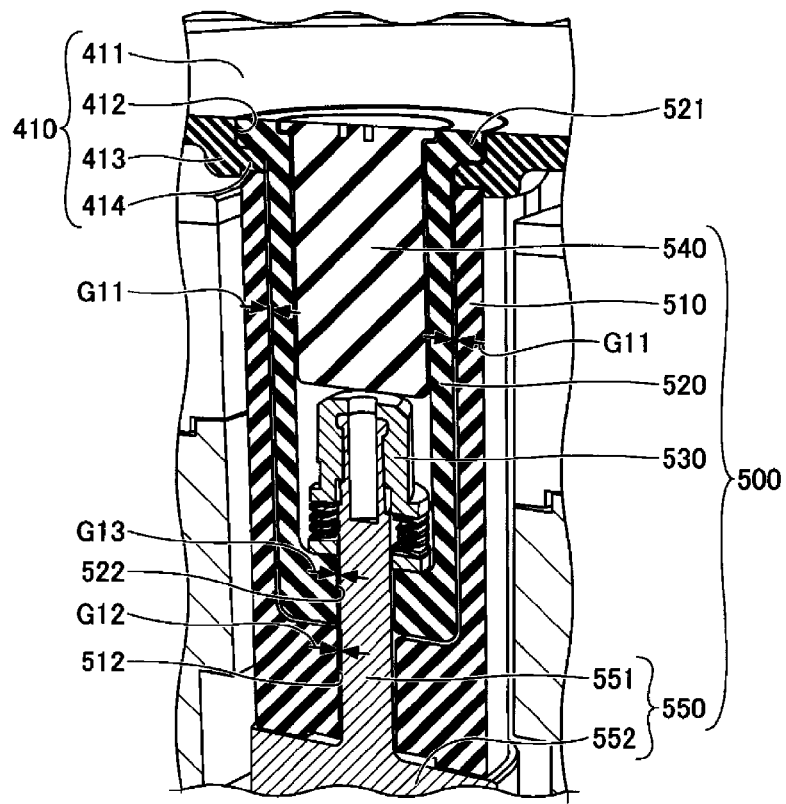

With reference to FIGS. 5A and 5B, an example of a mechanism that fixes the stage 321a in the film forming apparatus 300 described above will be described. FIGS. 5A and 5B are views illustrating an example of the mechanism that fixes the stage. FIG. 5A is a cross-sectional view illustrating a positional relationship between the stage and clamps, and FIG. 5B is an enlarged view of the clamps of FIG. 5A.

First, an example of a configuration of the stage 321a will be described. Hereinafter, a rotary table 400 and a stage 410 will be described as the rotary table 321 and the stage 321a, respectively.

The stage 410 has a rotation center at a position spaced from the rotation center of the rotary table 400, and is configured to be rotatable with respect to the rotary table 400. Hereinafter, the rotation center of the rotary table 400 will be referred to as a revolution center, and the rotation center of the stage 410 will be referred to as a rotation center. The revolution center and the rotation center are spaced from each other by, for example, 300 mm to 400 mm. Thus, when the rotary table 400 rotates, a centrifugal force acts on the stage 410. In particular, when the rotary table 400 rotates at a high speed (e.g., 200 rpm or more), a large centrifugal force acts on the stage 410.

The stage 410 is formed of, for example, a material having a relatively high heat conductivity, such as $Al_2O_3$, AlN, or SiC. The stage 410 includes a mounting portion 411, an opening 412, a thickness portion 413, and a flange portion 414.

The mounting portion 411 is a recess formed in the upper surface of the stage 410. The mounting portion 411 has an outer diameter slightly larger than that of the substrate W, and has substantially the same depth as that of the substrate W. The substrate W is mounted on the mounting portion 411.

The opening 412 is formed at the rotation center of the stage 410. In other words, the opening 412 is formed at the position spaced from the rotation center of the rotary table 400. The opening 412 has, for example, a circular shape.

The thickness portion 413 is a portion that extends downward from the lower surface of the stage 410 around the opening 412 of the stage 410, and has an annular shape.

The flange portion 414 is a portion that protrudes from the inner wall of the thickness portion 413 toward the center of the opening 412, and has an annular shape. The upper surface of the flange portion 414 is disposed below the upper surface of the mounting portion 411 of the stage 410.

The fixing mechanism 500 includes a first clamp 510, a second clamp 520, a pressing member 530, a lid 540, and a shaft 550. The first clamp 510, the second clamp 520, the pressing member 530, the lid 540, and the shaft 550 function as the rotation shaft 321b described above.

The first clamp 510 has a bottomed cylindrical shape, and is configured such that the upper end of the cylindrical shape comes into contact with the lower surface of the flange portion 414 of the stage 410. At the bottom of the first clamp 510, a first through hole 512 is formed such that an insertion portion 551 of the shaft 550 may be inserted through the first through hole 512. The first through hole 512 has an inner diameter slightly (e.g., 0.1 to 5.0 mm) larger than the outer diameter of the insertion portion 551. The first clamp 510 is formed of a material having a heat resistant temperature higher than the temperature of the film forming process (e.g., 600° C.) performed in the film forming apparatus 300 and having a heat conductivity lower than that of the stage 410. For example, when the stage 410 is formed of $Al_2O_3$, AlN, or SiC, the first clamp 510 is formed of, for example, quartz. Further, the first clamp 510 may be formed of a material having a heat conductivity 10 or more times lower than that of the stage 410.

The second clamp 520 is provided inside the first clamp 510 with a gap G11 from the inner wall of the first clamp 510. The gap G11 may be, for example, 0.1 mm to 5.0 mm. The second clamp 520 has a bottomed cylindrical shape with an outer diameter smaller than the inner diameter of the first clamp 510. The second clamp 520 includes a contact portion 521. The contact portion 521 has an annular shape that extends outward from the outer wall of the upper end of the second clamp 520, and comes into contact with the upper surface of the flange portion 414 formed on the stage 410. At the bottom of the second clamp 520, a second through hole 522 is formed such that the insertion portion 551 of the shaft 550 may be inserted through the second through hole 522. The second through hole 522 has an inner diameter slightly (e.g., 0.1 mm to 5.0 mm) larger than the outer diameter of the insertion portion 551. The second clamp 520 is formed of a material having a heat resistant temperature higher than the temperature of the film forming process (e.g., 600° C.) performed in the film forming apparatus 300 and having a heat conductivity lower than that of the stage 410. For example, when the stage 410 is formed of $Al_2O_3$, AlN, or SiC, the second clamp 520 is formed of, for example, quartz. Further, the second clamp 520 may be formed of a material having a heat conductivity 10 or more times lower than that of the stage 410. The second clamp 520 may be formed of the same material as that of the first clamp 510, from the viewpoint of suppressing an occurrence of a difference in thermal expansion.

In this way, the upper end of the first clamp 510 comes into contact with the lower surface of the flange portion 414, and the contact portion 521 of the second clamp 520 comes into contact with the upper surface of the flange portion 414, so that the flange portion 414 is inserted between the first clamp 510 and the second clamp 520.

The pressing member 530 presses the first clamp 510 and the second clamp 520 in the direction in which the first and second clamps 510 and 520 approach each other. For example, the pressing member 530 is disposed on the inside bottom surface of the second clamp 520, and presses the bottom of the second clamp 520 toward the bottom of the first clamp 510. Accordingly, the flange portion 414 is inserted between the upper end of the first clamp 510 and the contact portion 521 of the second clamp 520, and fixed by the pressing force of the pressing member 530. As a result, the centrifugal force generated when the rotary table 400 rotates suppresses the stage 410, the second clamp 520 and others from falling toward the outer periphery of the rotary table 400. The pressing member 530 includes, for example, a disc spring.

The lid 540 has a columnar shape having substantially the same outer diameter as the inner diameter of the second clamp 520, and is inserted into the second clamp 520 to close the upper opening of the second clamp 520. Accordingly, the pressing member 530 is suppressed from being exposed to the raw material gas or the reaction gas. Thus, even when the pressing member 530 is formed of a metal material, the corrosion of the pressing member 530 may be suppressed. The lid 540 may be formed of a material having a heat resistant temperature higher than the temperature of the film forming process (e.g., 600° C.) performed in the film forming apparatus 300 and having a heat absorption rate higher than that of the stage 410. For example, when the stage 410 is formed of $Al_2O_3$, the lid 540 may be formed of, for example, SiC or carbon (C).

The shaft 550 is formed of, for example, a metal material, and includes an insertion portion 551 and a penetration portion 552.

The insertion portion 551 is the upper portion of the shaft 550. The insertion portion 551 penetrates the first through hole 512 and the second through hole 522, such that the upper end thereof is fixed by the pressing member 530 inside the second clamp 520. Since the outer diameter of the insertion portion 551 is slightly larger than the inner diameter of the first through hole 512, a gap G12 is formed between the outer wall of the insertion portion 551 and the inner wall of the first through hole 512. Further, since the outer diameter of the insertion portion 551 is slightly larger than the inner diameter of the second through hole 522, a gap G13 is formed between the outer wall of the insertion portion 551 and the inner wall of the second through hole 522.

The penetration portion 552 is the lower portion of the shaft 550. The penetration portion 552 is provided to penetrate the ceiling 322b of the accommodation box 322. The lower end of the penetration portion 552 is disposed inside the accommodation box 322. The penetration portion 552 transmits the power of the rotation motor 321c (FIG. 4) disposed inside the accommodation box 322 to the stage 410 via the first clamp 510 and the second clamp 520. In other words, when the penetration portion 552 rotates by the power of the rotation motor 321c, the first clamp 510, the second clamp 520, and the stage 410 rotate. The insertion portion 551 and the penetration portion 552 may be formed as separate bodies.

According to the fixing mechanism 500 described above, the stage 410 is inserted between the first clamp 510 and the second clamp 520, and fixed in the manner that the pressing member 530 presses the first clamp 510 and the second clamp 520 in the direction in which the first and second clamps 510 and 520 approach each other. Accordingly, the difference in thermal expansion may be absorbed in a state where the rotation center is aligned. As a result, the damage of the stage 410, the fixing mechanism 500 and others caused from a thermal stress may be suppressed.

Further, according to the fixing mechanism 500, the gaps G12 and G13 are formed between the insertion portion 551 and the first through hole 512 and between the insertion portion 551 and the second through hole 522. Thus, even when the difference in thermal expansion occurs between the insertion portion 551 and the first clamp 510 and between the insertion portion 551 and the second clamp 520, the generation of stress on the insertion portion 551, the first clamp 510, the second claim 520 and others may be suppressed. As a result, the damage of the first clamp 510, the second clamp 520, the stage 410 and others may be suppressed.

Further, according to the fixing mechanism 500, the shaft 550 is covered with the first clamp 510 and the second clamp 520, and fixed by the pressing force of the pressing member 530 disposed on the inside bottom surface of the second clamp 520. Accordingly, the shaft 550 is suppressed from being exposed to the raw material gas or the reaction gas. As a result, even when the shaft 550 is formed of a material corrosive to the raw material gas or the reaction gas, the corrosion of the shaft 550 may be suppressed.

Further, according to the fixing mechanism 500, the shaft 550 is provided to penetrate the ceiling 322b of the accommodation box 322, and the lower end of the shaft 550 disposed inside the accommodation box 322 becomes a portion connected to the rotation motor 321c. Accordingly, the rotation motor 321c may be disposed inside the accommodation box 322. As a result, the temperature rise of the rotation motor 321c may be suppressed.

[Fixing Mechanism of Rotary Table]

Figure 6:
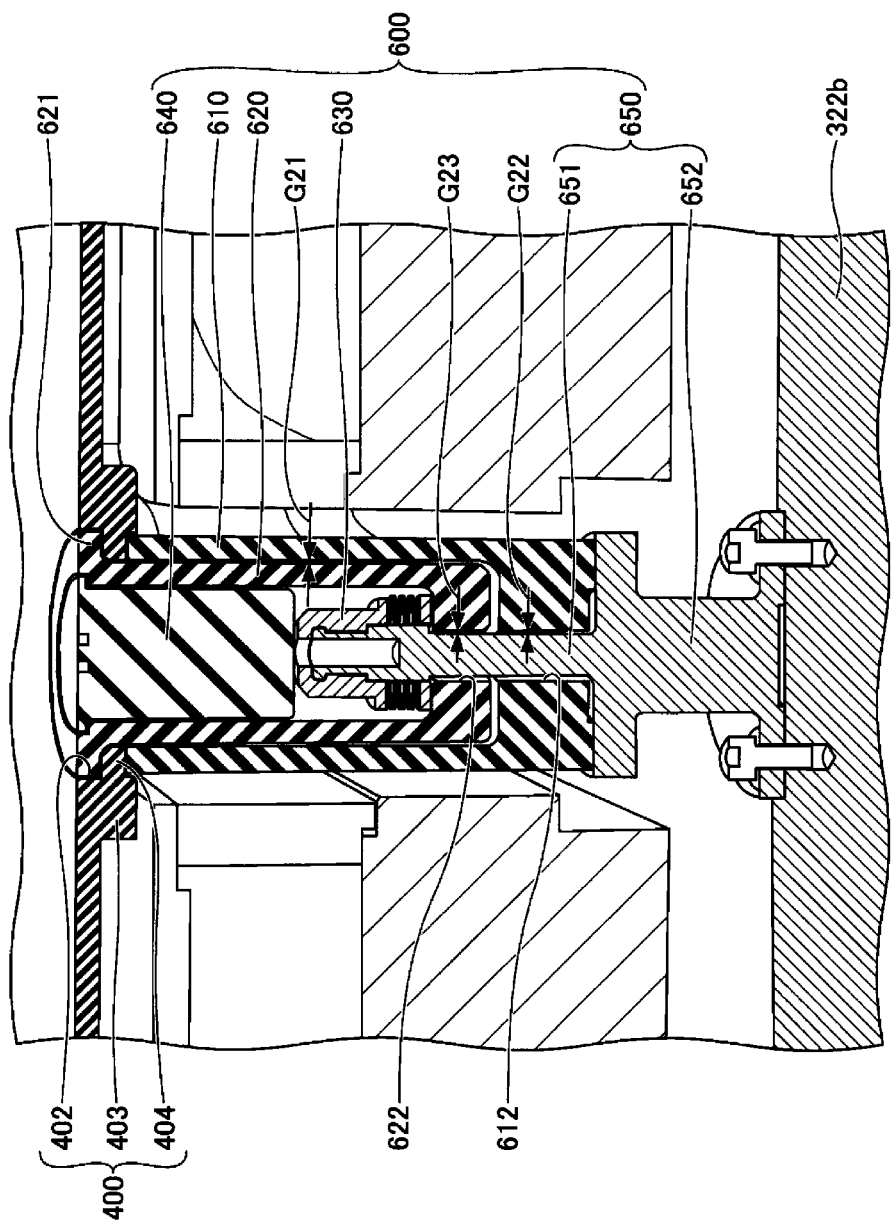
FIG. 6 is a view illustrating an example of a mechanism that fixes the rotary table.

With reference to FIG. 6, an example of a mechanism that fixes the rotary table 321 in the film forming apparatus 300 described above will be described. FIG. 6 is a view illustrating an example of the mechanism that fixes the rotary table.

First, an example of a configuration of the rotary table 321 will be described. Hereinafter, the rotary table 400 will be described as the rotary table 321.

The rotary table 400 is rotatably provided inside the vacuum container 311. The rotary table 400 includes an opening 402, a thickness portion 403, and a flange portion 404.

A plurality of openings 402 is formed along the circumferential direction of the rotary table 400, at positions spaced from the rotation center of the rotary table 400. Each opening 402 has, for example, a circular shape.

The thickness portion 403 is a portion that extends downward from the lower surface of the rotary table 400 around the opening 402 of the rotary table 400, and has an annular shape.

The flange portion 404 is a portion that protrudes from the inner wall of the thickness portion 403 toward the center of the opening 402, and has an annular shape. The upper surface of the flange portion 404 is disposed below the upper surface of the rotary table 400.

The fixing mechanism 600 includes a first clamp 610, a second clamp 620, a pressing member 630, a lid 640, and a shaft 650. The first clamp 610, the second clamp 620, the pressing member 630, the lid 640, and the shaft 650 function as the connection unit 321d described above.

The first clamp 610 has a bottomed cylindrical shape and is configured such that the upper end of the cylindrical shape comes into contact with the lower surface of the flange portion 404 of the rotary table 400. At the bottom of the first clamp 610, a first through hole 612 is formed such that an insertion portion 651 of the shaft 650 may be inserted through the first through hole 612. The first through hole 612 has an inner diameter slightly (e.g., 0.1 mm to 5.0 mm) larger than the outer diameter of the insertion portion 651.

The first clamp 610 is formed of a material having a heat resistant temperature higher than the temperature of the film forming process (e.g., 600° C.) performed in the film forming apparatus 300, such as, for example, quartz or ceramics.

The second clamp 620 is provided inside the first clamp 610 with a gap G21 from the inner wall of the first clamp 610. The gap G21 may be, for example, 0.1 mm to 5.0 mm. The second clamp 620 has a bottomed cylindrical shape with an outer diameter smaller than the inner diameter of the first clamp 610. The second clamp 620 includes a contact portion 621. The contact portion 621 has an annular shape that extends outward from the outer wall of the upper end of the second clamp 620, and comes into contact with the upper surface of the flange portion 404 formed on the stage 410. At the bottom of the second clamp 620, a second through hole 622 is formed such that the insertion portion 651 of the shaft 650 may be inserted through the second through hole 622. The second through hole 622 has an inner diameter slightly (e.g., 0.1 mm to 5.0 mm) larger than the outer diameter of the insertion portion 651. The second clamp 620 is formed of a material having a heat resistant temperature higher than the temperature of the film forming process (e.g., 600° C.) performed in the film forming apparatus 300, such as, for example, quartz or ceramics. The second clamp 620 may be formed of the same material as that of the first clamp 610, from the viewpoint of suppressing the occurrence of a difference in thermal expansion.

In this way, the upper end of the first clamp 610 comes into contact with the lower surface of the flange portion 404, and the contact portion 621 of the second clamp 620 comes into contact with the upper surface of the flange portion 404, so that the flange portion 404 is inserted between the first clamp 610 and the second clamp 620.

The pressing member 630 presses the first clamp 610 and the second clamp 620 in the direction in which the first and second clamps 610 and 620 approach each other. For example, the pressing member 630 is disposed on the inside bottom surface of the second clamp 620, and presses the bottom of the second clamp 620 toward the bottom of the first clamp 610. Accordingly, the flange portion 404 is inserted between the upper end of the first clamp 610 and the contact portion 621 of the second clamp 620, and fixed by the pressing force of the pressing member 630. The pressing member 630 includes, for example, a disc spring.

The lid 640 has a columnar shape having substantially the same outer diameter as the inner diameter of the second clamp 620, and is inserted into the second clamp 620 to close the upper opening of the second clamp 620. Accordingly, the pressing member 630 is suppressed from being exposed to the raw material gas or the reaction gas. Thus, even when the pressing member 630 is formed of a metal material, the corrosion of the pressing member 630 may be suppressed. The lid 640 may be formed of a material having a heat resistant temperature higher than the temperature of the film forming process (e.g., 600° C.) performed in the film forming apparatus 300, such as, for example, quartz or ceramics.

The shaft 650 is formed of, for example, a metal material, and includes an insertion portion 651 and a support 652.

The insertion portion 651 is the upper portion of the shaft 650. The insertion portion 651 penetrates the first through hole 612 and the second through hole 622, such that the upper end thereof is fixed by the pressing member 630 inside the second clamp 620. Since the outer diameter of the insertion portion 651 is slightly larger than the inner diameter of the first through hole 612, a gap G22 is formed between the outer wall of the insertion portion 651 and the inner wall of the first through hole 612. Further, since the outer diameter of the insertion portion 651 is slightly larger than the inner diameter of the second through hole 622, a gap G23 is formed between the outer wall of the insertion portion 651 and the inner wall of the second through hole 622.

The support 652 is the lower portion of the shaft 650. The lower end of the support 652 is fixed to the upper surface of the ceiling 322b of the accommodation box 322. Further, the insertion portion 651 and the support 652 may be formed as separate bodies.

According to the fixing mechanism 600 described above, the rotary table 400 is inserted between the first clamp 610 and the second clamp 620, and fixed in the manner that the pressing member 630 presses the first clamp 610 and the second clamp 620 in the direction in which the first and second clamps 610 and 620 approach each other. Accordingly, the difference in thermal expansion may be absorbed in a state where the revolution center is aligned. As a result, the damage of the rotary table 400, the fixing mechanism 600 and others caused from the thermal stress may be suppressed.

Further, according to the fixing mechanism 600, the gaps G22 and G23 are formed between the insertion portion 651 and the first through hole 612 and between the insertion portion 651 and the second through hole 622. Thus, even when the difference in thermal expansion occurs between the insertion portion 651 and the first clamp 610 and between the insertion portion 651 and the second clamp 620, the generation of stress on the insertion portion 651, the first clamp 610, the second clamp 620 and others may be suppressed. As a result, the damage of the first clamp 610, the second clamp 620, the rotary table 400 and others may be suppressed.

Further, according to the fixing mechanism 600, the shaft 650 is covered with the first clamp 610 and the second clamp 620, and fixed by the pressing force of the pressing member 630 disposed on the inside bottom surface of the second clamp 620. Accordingly, the shaft 650 is suppressed from being exposed to the raw material gas or the reaction gas. As a result, even when the shaft 650 is formed of a material corrosive to the raw material gas or the reaction gas, the corrosion of the shaft 650 may be suppressed.

[Operation of Rotation Driving Device]

Figure 7:
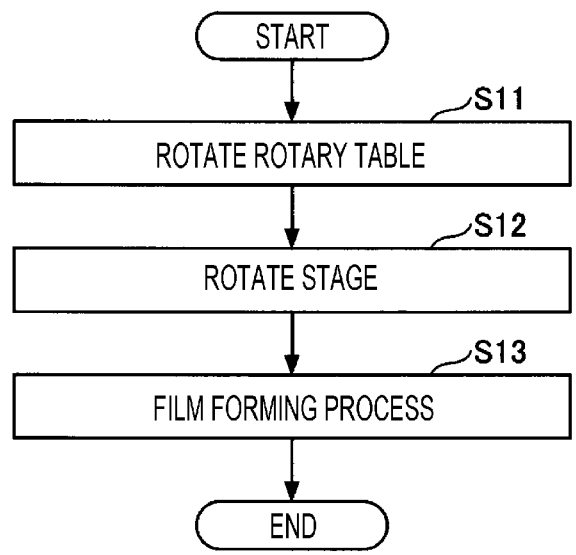
FIG. 7 is a flowchart illustrating an example of an operation of a rotation driving device.

With reference to FIG. 7, an example of an operation (rotation driving method) of the rotation driving device 320 will be described. FIG. 7 is a flowchart illustrating an example of the operation of the rotation driving device 320.

Hereinafter, for example, descriptions will be made on a case where a film is formed on the substrate mounted on the stage 321a by the atomic layer deposition (ALD) in a state where the controller 390 controls the film forming apparatus 300 to rotate the rotary table 321 and the stage 321a. The rotation driving method illustrated in FIG. 7 includes steps S11 to S13.

In step S11, the controller 390 controls the revolution motor 324 to rotate the rotary table 321. Accordingly, the substrates W on the plurality of stages 321a provided along the circumferential direction of the rotary table 321 revolve. The rotation speed of the rotary table 321 may be, for example, 1 rpm to 500 rpm.

In step S12, the controller 390 controls the rotation motor 321c to rotate each of the plurality of stages 321a provided along the circumferential direction of the rotary table 321 with respect to the rotary table 321. Accordingly, the substrate W mounted on each stage 321a rotates. The rotation speed of the stage 321a may be, for example, 1 rpm to 30 rpm.

In step S13, the controller 390 controls the processing unit 310 to perform the film forming process on the substrates W. For example, in a state where the separation gas is supplied from the separation gas nozzles 312c and 312d to the separation regions D, the controller 390 supplies the raw material gas from the raw material gas nozzle 312a to the raw material gas adsorption region P1, and supplies the reaction gas from the reaction gas nozzle 312b to the reaction gas supply region P2. Accordingly, when the substrates W mounted on the stages 321a of the rotary table 321 repeatedly pass through the raw material gas adsorption region P1 and the reaction gas supply region P2, the film by the ALD is deposited on the surfaces of the substrates W.

According to the rotation driving method above, the substrate W mounted on each stage 321a repeatedly passes through the raw material gas adsorption region P1 and the reaction gas supply region P2 while being rotated, so that the film by the ALD is formed on the surface of the substrate W. As a result, the uniformity of the film in the circumferential direction of the substrate W is improved.

Further, according to the rotation driving method above, the rotation motor 321c for rotating the stage 321a is disposed inside the accommodation box 322 isolated from the inside of the vacuum container 311. Thus, for example, particles caused by the mechanical contact of bearings or the like included in the rotation motor 321c may be confined in the accommodation box 322. As a result, the particles may be prevented from entering the process region. Further, since the rotation motor 321c does not come into contact with the raw material gas and the reaction gas that are introduced into the vacuum container 311, the corrosion of the rotation motor 321c by the raw material gas and the reaction gas may be prevented.

Further, since the rotation motor 321c may be disposed in the installation location of the film forming apparatus 300, for example, in the accommodation box 322 which may be maintained in the same environment as a clean room, rather than in the decompression environment inside the vacuum container 311, the stable operation of the rotation motor 321c may be implemented. As a result, the stage 321a operated by the rotation motor 321c may be rotated with a satisfactory accuracy.

Figure 8:
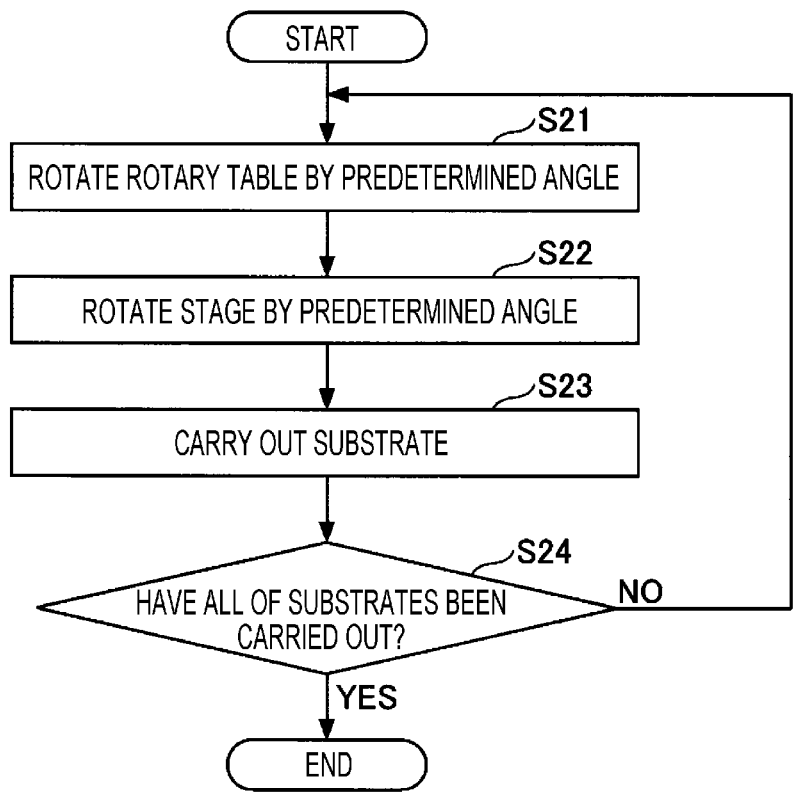
FIG. 8 is a flowchart illustrating another example of the operation of the rotation driving device.

With reference to FIG. 8, another example of the operation (rotation driving method) of the rotation driving device 320 will be described. FIG. 8 is a flowchart illustrating another example of the operation of the rotation driving device 320.

In the following, for example, descriptions will be made on an operation in which the controller 390 controls the rotary driving device 320 to rotate the rotary table 321 and the stage 321a, and then, the substrate W mounted on the stage 321a of the rotary table 321 is carried out of the vacuum container 311. For example, the rotation driving method illustrated in FIG. 8 is performed after the film forming process is completed on the substrates W mounted on the plurality of stages 321a. The rotation driving method illustrated in FIG. 8 includes steps S21 to S24.

In step S21, the controller 390 controls the revolution motor 324 to rotate the rotary table 321 by a predetermined angle such that one of the plurality of stages 321a moves to the position facing the transfer port 314.

In step S22, the controller 390 controls the rotation motor 321c to rotate the stage 321a that has moved to the position facing the transfer port 314, and rotate the substrate W mounted on the stage 321a, thereby positioning the substrate W in the rotation direction of the substrate W.

In step S23, the controller 390 opens the gate valve, and carries out the substrate W mounted on the stage 321a at the position facing the transfer port 314 by the transfer arm 314a provided outside via the transfer port 314a.

In step S24, the controller 390 determines whether all of the substrates W mounted on the plurality of stages 321a have been carried out. When it is determined in step S24 that all of the substrates W have been carried out, the controller 390 ends the process. Meanwhile, when it is determined in step S24 that all of the substrates W have not been carried out, the controller 390 returns the process to step S21.

According to the rotation driving method above, when the substrate W for which the film forming process has been completed is carried out, the rotary table 321 is revolved, the stage 321a is rotated, and then, the substrate W mounted on the stage 321a of the rotary table 321 is carried out. Accordingly, the substrate W may be carried out in a state where the substrate W is positioned in the rotation direction.

Further, according to the rotation driving method above, the rotation motor 321c for rotating the stage 321a is disposed inside the accommodation box 322 isolated from the inside of the vacuum container 311. Thus, for example, particles caused by the mechanical contact of bearings or the like included in the rotation motor 321c may be confined in the accommodation box 322. As a result, the particles may be prevented from entering the process region. Further, since the rotation motor 321c does not come into contact with the gas introduced into the vacuum container 311, the corrosion of the rotation motor 321c by the gas may be prevented.

Further, since the rotation motor 321c may be disposed in the installation location of the film forming apparatus 300, for example, in the accommodation box 322 which may be maintained in the same environment as a clean room, rather than in the decompression environment inside the vacuum container 311, the stable operation of the rotation motor 321c may be implemented. As a result, the stage 321a operated by the rotation motor 321c may be rotated with a satisfactory accuracy.

[Temperature Distribution in Plane of Substrate]

With reference to FIGS. 9A, 9B, 10A, and 10B, descriptions will be made on the temperature distribution in the plane of the substrate when a predetermined processing is performed on the substrate W by the film forming apparatus 300 of the embodiment.

Figure 9A:
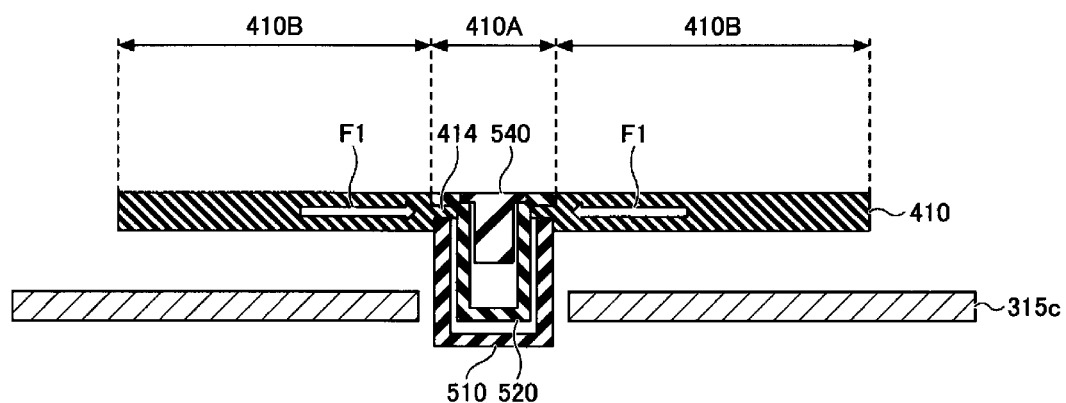
FIGS. 9A and 9B are views illustrating a heat conduction in the plane of the stage.
Figure 9B:
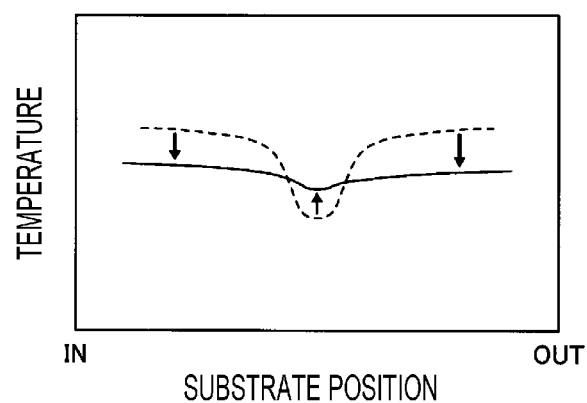

FIGS. 9A and 9B are views illustrating a heat conduction in the plane of the stage 410. FIG. 9A is a schematic cross-sectional view illustrating a positional relationship among the stage 410, the first clamp 510, the second clamp 520, the lid 540, and the heater 315c. FIG. 9B is a schematic view of an in-plane temperature distribution of the substrate W mounted on the stage 410 when the stage 410 is heated by the heater 315c in a state where the rotary table 400 is revolved at a speed of 5 rpm, and the stage 410 is rotated at a speed of 5 rpm. In FIG. 9B, the horizontal axis represents the substrate position, and the vertical axis represents the temperature. As for the substrate position, "IN" indicates the end position in the plane of the substrate W close to the center of the rotary table 400, and "OUT" indicates the end position in the plane of the substrate W close to the outer periphery of the rotary table 400.

Figure 10A:
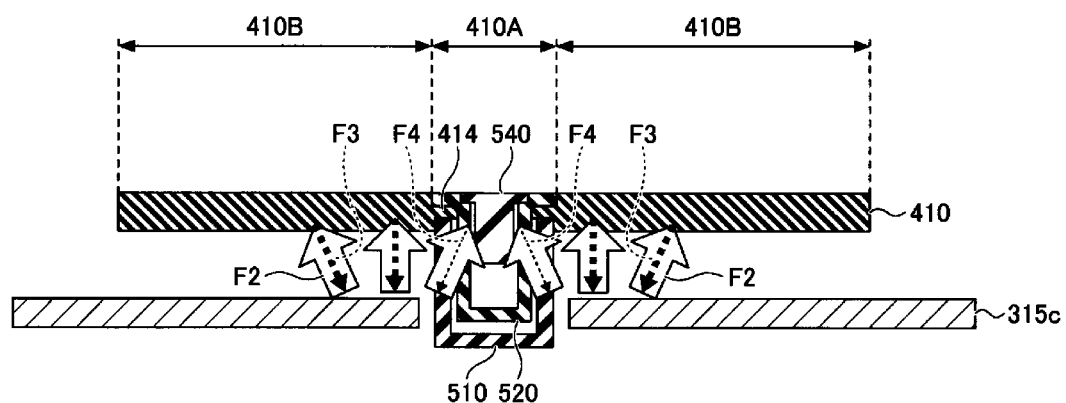
FIGS. 10A and 10B are views illustrating a heat adsorption in the plane of the stage.
Figure 10B:
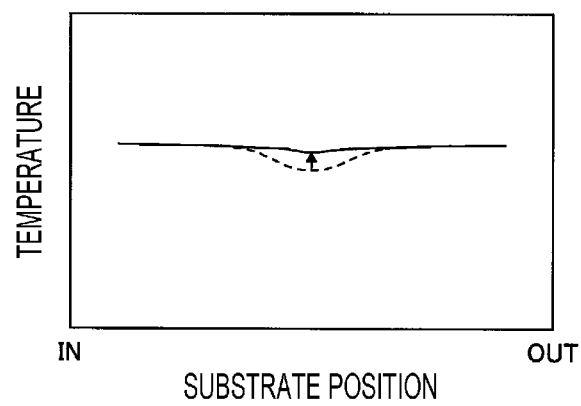

FIGS. 10A and 10B are views illustrating a heat absorption in the plane of the stage 410. FIG. 10A is a schematic cross-sectional view illustrating a positional relationship among the stage 410, the first clamp 510, the second clamp 520, the lid 540, and the heater 315c. FIG. 10B is a schematic view of an in-plane temperature distribution of the substrate W mounted on the stage 410 when the stage 410 is heated by the heater 315c in a state where the rotary table 400 is revolved at a speed of 5 rpm, and the stage 410 is rotated at a speed of 5 rpm. In FIG. 10B, the horizontal axis represents the substrate position, and the vertical axis represents the temperature. As for the substrate position, "IN" indicates the end position in the plane of the substrate W close to the center of the rotary table 400, and "OUT" indicates the end position in the plane of the substrate W close to the outer periphery of the rotary table 400.

As illustrated in FIGS. 9A and 10A, in the configuration where the flange portion 414 of a central region 410A of the stage 410 is inserted between the first clamp 510 and the second clamp 520, it may be difficult to install the heater 315c below the central region 410A of the stage 410. Thus, the heater 315c is provided below the region around the central region 410A of the stage 410 (hereinafter, referred to as a "peripheral region 410B"). Thus, the peripheral region 410B is heated by the heater 315c as compared to the central region 410A, and an in-plane temperature distribution in which the temperature of the peripheral region 410B becomes higher than the temperature of the central region 410A may easily occur. For example, when the material of the stage 410 is quartz, the heat conductivity is relatively low, and thus, a heat conduction hardly occurs between the central region 410A and the peripheral region 410B.

Meanwhile, in an example of the film forming apparatus 300 of the embodiment, the stage 410 is formed of a material having a heat conductivity higher than that of quartz. For example, the stage 410 is formed of $Al_2O_3$, AlN, or SiC. Accordingly, as indicated by the arrows F1 in FIG. 9A, a heat conduction occurs from the peripheral region 410B having a relatively high temperature toward the central region 410A having a relatively low temperature. As a result, as illustrated in FIG. 9B, the temperature difference between the central region 410A and the peripheral region 410B is reduced, so that the in-plane temperature uniformity of the substrate W mounted on the stage 410 is improved. In FIG. 9B, the dashed line indicates the temperature distribution when the material of the stage 410 is quartz, and the solid line indicates the temperature distribution when the material of the stage 410 is SiC.

Further, in an example of the film forming apparatus 300 of the embodiment, the lid 540 is formed of a material having a heat absorption rate higher than that of the stage 410. For example, the stage 410 is formed of $Al_2O_3$ or AlN, and the lid 540 is formed of SiC or carbon (C). Accordingly, while a part of electromagnetic waves emitted from the heater 315c is absorbed by the stage 410 and the lid 540 as indicated by the arrows F2 in FIG. 10A, a part thereof is reflected by the stage 410 and the lid 540 as indicated by the arrows F3 and F4 of FIG. 10A. At this time, since the lid 540 is formed of a material having a heat absorption rate higher than that of the stage 410, the amount of the electromagnetic waves absorbed by the lid 540 is larger than the amount of the electromagnetic waves absorbed by the stage 410. In other words, the amount of the electromagnetic waves reflected by the lid 540 (the arrows F4) becomes smaller than the amount of the electromagnetic waves reflected by the stage 410 (the arrows F3). Thus, the temperature of the lid 540 becomes higher than that of the stage 410. As a result, as illustrated in FIG. 10B, the temperature difference between the central region 410A and the peripheral region 410B is reduced, so that the in-plane temperature uniformity of the substrate W mounted on the stage 410 is improved. In FIG. 10B, the dashed line indicates the temperature distribution when the materials of the stage 410 and the lid 540 are $Al_2O_3$, and the solid line indicates the temperature distribution when the material of the stage 410 is Al₂O₃, and the material of the lid 540 is SiC.

EXAMPLES

With reference to FIGS. 11 to 14, examples conducted using the film forming apparatus 300 of the embodiment will be described together with comparative examples.

In Examples 1 to 3 and Comparative Example 1, an evaluation was conducted on the influence of the materials of the stage 410, the first clamp 510, the second clamp 520, and the lid 540 of the film forming apparatus 300 on the in-plane temperature distribution of the substrate W mounted on the stage 410, in a case where the stage 410 is not rotated.

In Examples 1 to 3 and Comparative Example 1, the in-plane temperature distribution of the substrate W mounted on the stage 410 was measured, in a state where the heater 315c was set to 300° C., the rotary table 400 was revolved at a speed of 5 rpm, and the stage 410 was not rotated. Further, based on the measured in-plane temperature distribution, the difference between the maximum temperature and the minimum temperature in the plane of the substrate W (hereinafter, referred to as a "temperature range R") was calculated.

Figure 11:
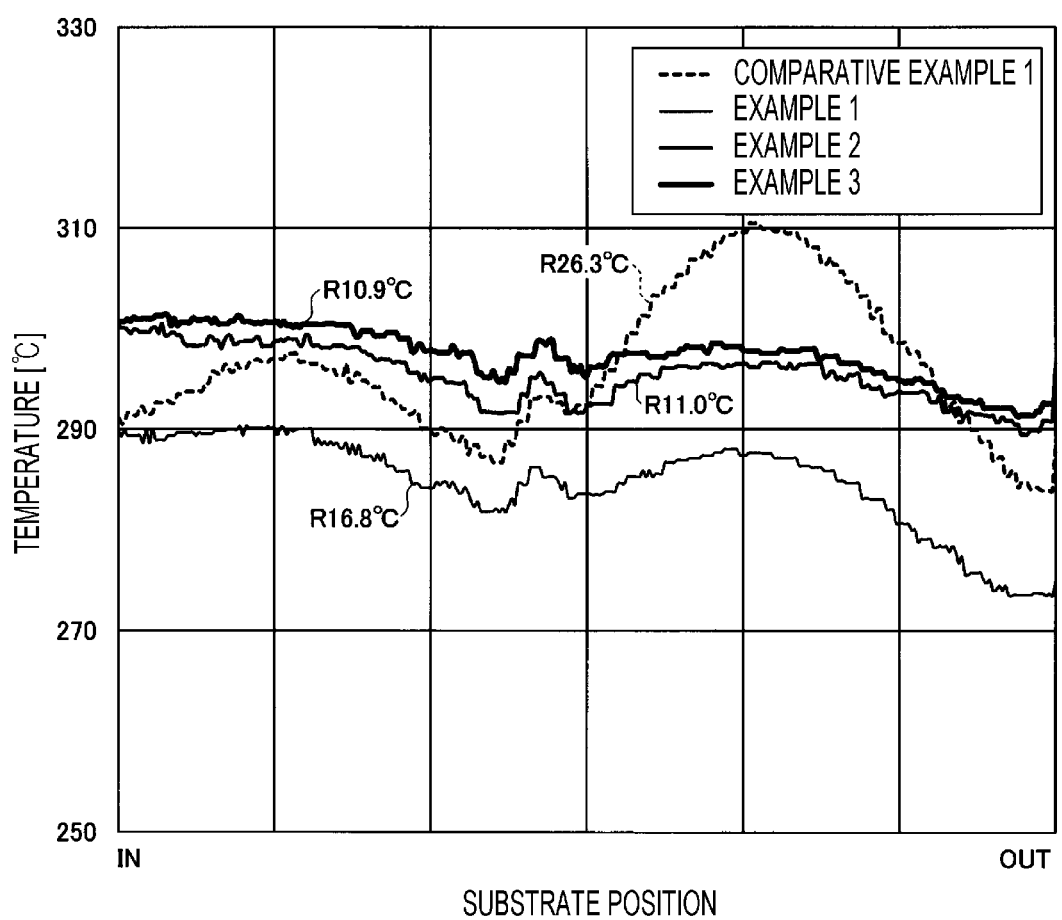
FIG. 11 is a view illustrating a measurement result of a temperature distribution when materials of the stage and the fixing mechanism are changed.

Table 1 represents the materials of the stage 410, the first clamp 510, the second clamp 520, and the lid 540 in Examples 1 to 3 and Comparative Example 1. Further, FIG. 11 illustrates measurement results of the in-plane temperature distribution of the substrate W in Examples 1 to 3 and Comparative Example 1.

TABLE 1

| | Stage | First Clamp | Second Clamp | Lid |
|---|---|---|---|---|
| Example 1 | Al₂O₃ | Quartz | Quartz | SiC |
| Example 2 | SiC | Quartz | SiC | SiC |
| Example 3 | SiC | Quartz | Quartz | SiC |
| Comparative Example 1 | Quartz | Quartz | Quartz | Quartz |

As represented in Table 1, all of Examples 1 to 3 are examples of a case where the first clamp 510 is formed of a material having a heat conductivity lower than that of the stage 410. Comparative Example 1 is an example of a case where the first clamp 510 is formed of a material having the same heat conductivity as that of the stage 410.

In FIG. 11, the horizontal axis represents the substrate position, and the vertical axis represents the temperature [° C.]. As for the substrate position, "IN" indicates the end position in the plane of the substrate W close to the center of the rotary table 400, and "OUT" indicates the end position in the plane of the substrate W close to the outer periphery of the rotary table 400.

As illustrated in FIG. 11, in Comparative Example 1, the temperature of the center of the substrate W is lower than the temperature around the center of the substrate W, and the temperature range R is 26.3° C. It is believed that this is because the heater 315c is not provided below the center of the substrate W since the fixing mechanism 500 is provided below the center of the substrate W, and thus, the center of the substrate W is hard to be heated as compared to the periphery of the center of the substrate W where the heater 315c is provided. Meanwhile, in Examples 1 to 3, the temperature of the center of the substrate W and the temperature around the center of the substrate W are substantially the same, and the temperature ranges R are 16.8° C., 11.0° C., and 10.9° C., respectively. It is believed that this is because the stage 410 is formed of Al₂O₃ or SiC which is a material having a heat conductivity higher than quartz, and thus, the heat around the center of the substrate W is efficiently transferred to the center of the substrate W. This result confirms that when the stage 410 is not rotated, the stage 410 may be formed of the material having a heat conductivity higher than quartz, thereby improving the temperature uniformity in the plane of the substrate.

Further, it is believed that this is because the first clamp 510 is formed of a material having a heat conductivity lower than that of the stage 410, and thus, the heat dissipation through the first clamp 510 at the center of the substrate W is suppressed. This result confirms that when the stage 410 is not rotated, the first clamp 510 may be formed of a material having a heat conductivity lower than that of the stage 410, thereby improving the temperature uniformity in the plane of the substrate.

Further, as illustrated in FIG. 11, it may be seen that the temperature range R of Example 3 is 10.9° C. which is smaller than the temperature range R of Example 1, i.e., 16.8° C. From this result, it may be said that when the stage 410 is not rotated, the material of the stage 410 is preferably SiC rather than Al₂O₃, from the viewpoint of improving the temperature uniformity in the plane of the substrate.

In Examples 4 to 6 and Comparative Example 2, an evaluation was conducted on the influence of the materials of the stage 410, the first clamp 510, the second clamp 520, and the lid 540 of the film forming apparatus 300 on the in-plane temperature distribution of the substrate W mounted on the stage 410.

In Examples 4 to 6 and Comparative Example 2, the in-plane temperature distribution of the substrate W mounted on the stage 410 was measured, in a state where the heater 315c was set to 300° C., the rotary table 400 was revolved at a speed of 5 rpm, and the stage 410 was not rotated at a speed of 5 rpm. Further, the temperature range R was calculated based on the measured in-plane temperature distribution.

Figure 12:
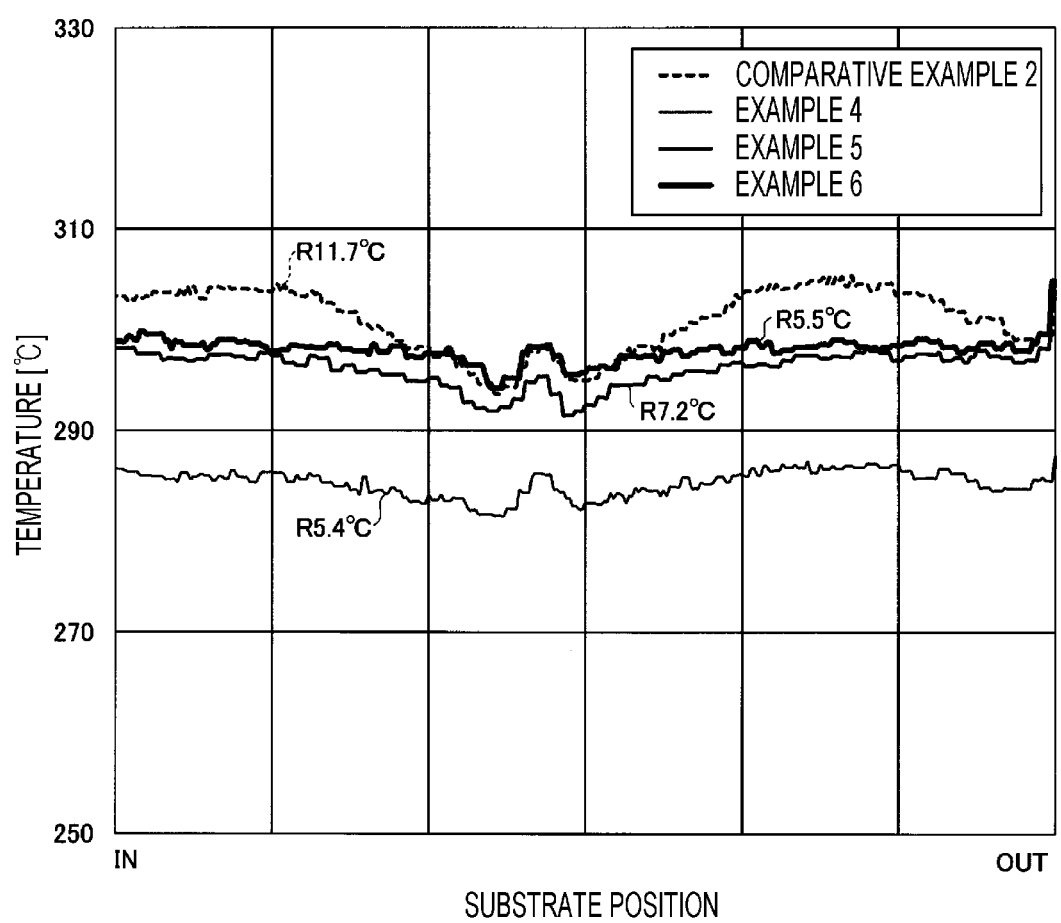
FIG. 12 is a view illustrating a measurement result of a temperature distribution when materials of the stage and the fixing mechanism are changed.

Table 2 represents the materials of the stage 410, the first clamp 510, the second clamp 520, and the lid 540 in Examples 4 to 6 and Comparative Example 2. Further, FIG. 12 illustrates measurement results of the in-plane temperature distribution of the substrate W in Examples 4 to 6 and Comparative Example 2.

TABLE 2

| | Stage | First Clamp | Second Clamp | Lid |
|---|---|---|---|---|
| Example 4 | Al₂O₃ | Quartz | Quartz | SiC |
| Example 5 | SiC | Quartz | SiC | SiC |
| Example 6 | SiC | Quartz | Quartz | SiC |
| Comparative Example 2 | Quartz | Quartz | Quartz | Quartz |

As represented in Table 2, all of Examples 4 to 6 are examples of a case where the first clamp 510 is formed of a material having a heat conductivity lower than that of the stage 410. Comparative Example 2 is an example of a case where the first clamp 510 is formed of a material having the same heat conductivity as that of the stage 410.

In FIG. 12, the horizontal axis represents the substrate position, and the vertical axis represents the temperature [° C.]. As for the substrate position, "IN" indicates the end position in the plane of the substrate W close to the center of the rotary table 400, and "OUT" indicates the end position in the plane of the substrate W close to the outer periphery of the rotary table 400.

As illustrated in FIG. 12, in Comparative Example 2, the temperature of the center of the substrate W is lower than the temperature around the center of the substrate W, and the temperature range R is 11.7° C. It is believed that this is because the heater 315c is not provided under the center of the substrate W since the fixing mechanism 500 is provided below the center of the substrate W, and thus, the center of the substrate W is hard to be heated as compared to the periphery of the center of the substrate W where the heater 315c is provided. Meanwhile, in Examples 4 to 6, the temperature of the center of the substrate W and the temperature around the center of the substrate W are substantially the same, and the temperature ranges R are 5.4° C., 7.2° C., and 5.5° C., respectively. It is believed that this is because the stage 410 is formed of $Al_2O_3$ or SiC which is a material having a heat conductivity higher than quartz, and thus, the heat around the center of the substrate W is efficiently transferred to the center of the substrate W. This result confirms that when the stage 410 is rotated, the stage 410 may be formed of a material having a heat conductivity higher than quartz, thereby improving the temperature uniformity in the plane of the substrate.

Further, it is believed that this is because the first clamp 510 is formed of a material having a heat conductivity lower than that of the stage 410, and thus, the heat dissipation through the first clamp 510 at the center of the substrate W is suppressed. This result confirms that when the stage 410 is rotated, the first clamp 510 may be formed of a material having a heat conductivity lower than that of the stage 410, thereby improving the temperature uniformity in the plane of the substrate.

Further, as illustrated in FIG. 12, it may be seen that the temperature ranges R of Examples 4 and 6 are 5.4° C. and 5.5° C., respectively, which are smaller than the temperature range R of Example 5, i.e., 7.2° C. From this result, it may be said that when the stage 410 is rotated, the material of the second clamp 520 is preferably quartz rather than SiC, from the viewpoint of improving the temperature uniformity in the plane of the substrate.

Figure 13:
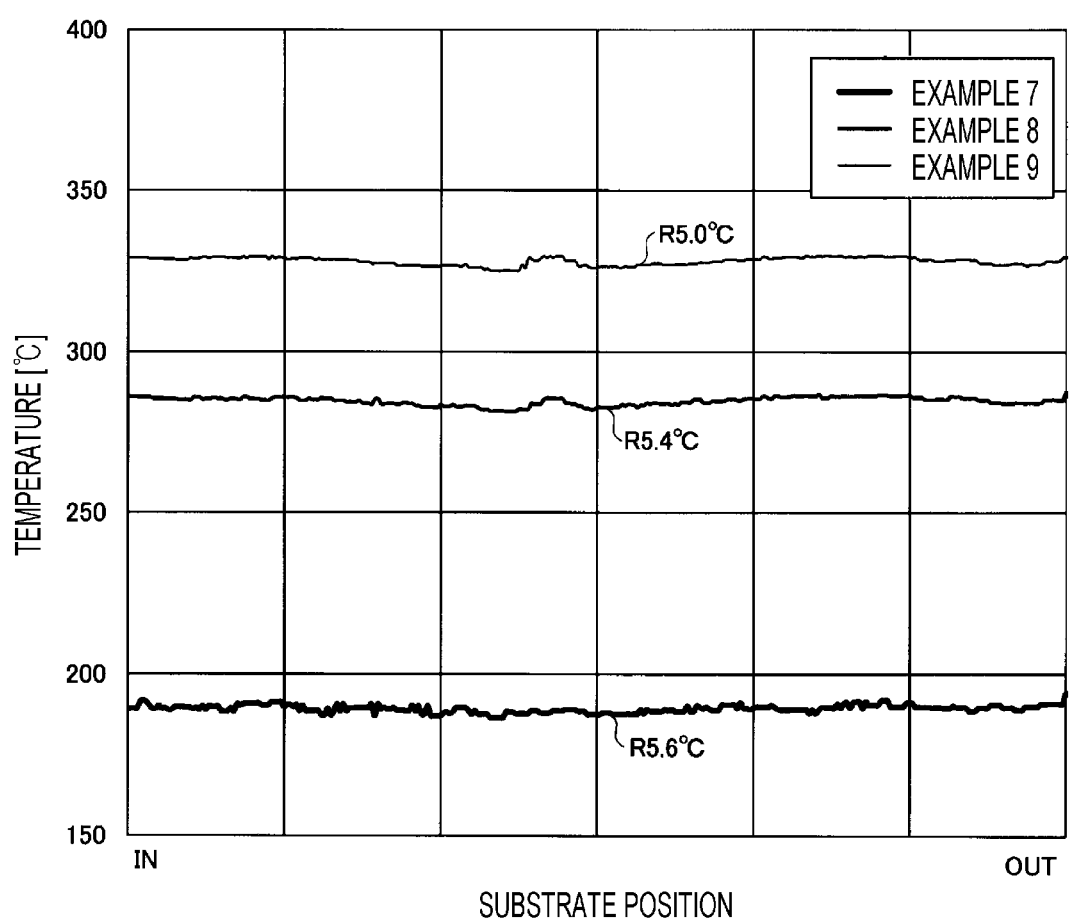
FIG. 13 is a view illustrating a measurement result of a temperature distribution when a heating temperature is changed.

In Examples 7 to 9, an evaluation was conducted on the influence of the set temperature of the heater 315c on the in-plane temperature distribution of the substrate W mounted on the stage 410. In Examples 7 to 9, the material of the stage 410 was $Al_2O_3$, the material of the lid 540 was SiC, and the materials of the first clamp 510 and the second clamp 520 were quartz. Further, in Examples 7 to 9, the in-plane temperature distribution of the substrate W mounted on the stage 410 was measured, in a state where the rotary table 400 was revolved at a speed of 5 rpm, and the stage 410 was rotated at a speed of 5 rpm. Further, the temperature range R was calculated based on the measured in-plane temperature distribution. Table 3 represents the set temperatures of the heater 315c in Examples 7 to 9. Further, FIG. 13 represents measurement results of the in-plane temperature distribution of the substrate W in Examples 7 to 9.

TABLE 3

| | Set Temperature of Heater |
|---|---|
| Example 7 | 200° C. |
| Example 8 | 300° C. |
| Example 9 | 350° C. |

As represented in Table 3, the set temperature of the heater was 200° C. in Example 7, 300° C. in Example 8, and 350° C. in Example 9.

In FIG. 13, the horizontal axis represents the substrate position, and the vertical axis represents the temperature [° C.]. As for the substrate position, "IN" indicates the end position in the plane of the substrate W close to the center of the rotary table 400, and "OUT" indicates the end position in the plane of the substrate W close to the outer periphery of the rotary table 400.

As represented in FIG. 13, in Examples 7 to 9, the temperature of the center of the substrate W and the temperature around the center of the substrate W are substantially the same, and the temperature ranges R are 5.6° C., 5.4° C., and 5.6° C., respectively. This result confirms that when the material of the stage 410 is $Al_2O_3$, the material of the lid 540 is SiC, and the materials of the first clamp 510 and the second clamp 520 are quartz, the temperature uniformity in the plane of the substrate is improved in the range of 200° C. to 350° C. for the set temperature of the heater 315c.

Figure 14:
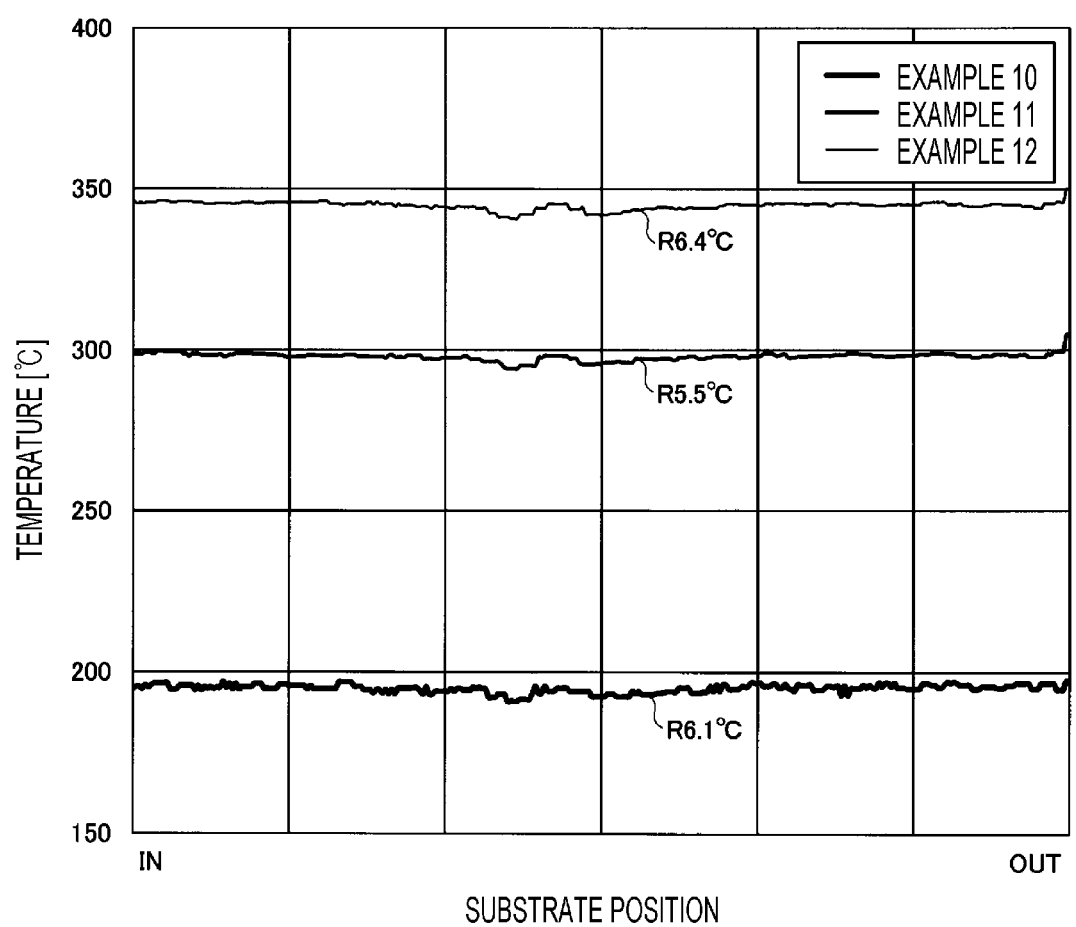
FIG. 14 is a view illustrating a measurement result of a temperature distribution when a heating temperature is changed.

In Examples 10 to 12, an evaluation was conducted on the influence of the set temperature of the heater 315c on the in-plane temperature distribution of the substrate W mounted on the stage 410. In Examples 10 to 12, the materials of the stage 410 and the lid 540 were SiC, and the materials of the first clamp 510 and the second clamp 520 were quartz. Further, in Examples 10 to 12, the in-plane temperature distribution of the substrate W mounted on the stage 410 was measured, in a state where the rotary table 400 was revolved at a speed of 5 rpm, and the stage 410 was rotated at a speed of 5 rpm. Further, the temperature range R was calculated based on the measured in-plane temperature distribution. Table 4 represents the set temperatures of the heater 315c in Examples 10 to 12. Further, FIG. 14 represents measurement results of the in-plane temperature distribution of the substrate W in Examples 10 to 12.

TABLE 4

| | Set Temperature of Heater |
|---|---|
| Example 10 | 200° C. |
| Example 11 | 300° C. |
| Example 12 | 350° C. |

As represented in Table 4, the set temperature of the heater was 200° C. in Example 10, 300° C. in Example 11, and 350° C. in Example 12.

In FIG. 14, the horizontal axis represents the substrate position, and the vertical axis represents the temperature [° C.]. As for the substrate position, "IN" indicates the end position in the plane of the substrate W close to the center of the rotary table 400, and "OUT" indicates the end position in the plane of the substrate W close to the outer periphery of the rotary table 400.

As represented in FIG. 14, in Examples 10 to 12, the temperature of the center of the substrate W and the temperature around the center of the substrate W are substantially the same, and the temperature ranges R are 6.1° C., 5.5° C., and 6.4° C., respectively. This result confirms that when the materials of the stage 410 and the lid 540 are SiC, and the materials of the first clamp 510 and the second clamp 520 are quartz, the temperature uniformity in the plane of the substrate is improved in the range of 200° C. to 350° C. for the set temperature of the heater 315c.

Further, in the embodiment described above, the first clamp 510 and the second clamp 520 are examples of low heat conductivity bodies.

According to the present disclosure, the temperature uniformity in the plane of a substrate may be improved.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a rotary table provided inside a processing container;
   a stage provided on an upper surface of the rotary table in order to mount a substrate thereon, and configured to revolve by a rotation of the rotary table;
   a lid formed of a material with a heat adsorption rate higher than that of the stage;
   a heater in communication with the stage and the lid, the heater configured to heat the substrate mounted on the stage; and
   a rotation shaft provided at a location that rotates together with the rotary table to freely rotate while supporting the stage, and including a low heat conductivity body formed of a material with a heat conductivity lower than that of the stage,
   wherein,
   the lid is in communication with the rotation shaft, and proximate to a central region of the stage;
   the stage includes a flange on a lower surface thereof,
   a first clamp and a second clamp form the rotation shaft with the flange inserted between the first and second clamps in a vertical direction of the stage; and
   the low heat conductivity body includes at least one of the first clamp and the second clamp.

2. The substrate processing apparatus according to claim 1, wherein the heater is provided at a position that does not overlap with the rotation shaft when viewed from top.

3. The substrate processing apparatus according to claim 2, wherein the low heat conductivity body is formed of a material with a heat conductivity 10 or more times lower than that of the stage.

4. The substrate processing apparatus according to claim 3, wherein the first clamp has a bottomed cylindrical shape with an upper end thereof in contact with a lower surface of the flange, and
   the second clamp is provided inside the first clamp with a gap from an inner wall of the first clamp, and has a bottomed cylindrical shape that includes a contact body in contact with an upper surface of the flange.

5. The substrate processing apparatus according to claim 4, wherein the lid is configured to close an opening of the second clamp.

6. The substrate processing apparatus according to claim 5, wherein the stage is formed of SiC, $Al_2O_3$, or AlN, and the low heat conductivity body is formed of quartz.

7. The substrate processing apparatus according to claim 1, wherein the low heat conductivity body is formed of a material with a heat conductivity 10 or more times lower than that of the stage.

8. The substrate processing apparatus according to claim 1, wherein the first clamp has a bottomed cylindrical shape with an upper end thereof in contact with a lower surface of the flange, and
   the second clamp is provided inside the first clamp with a gap from an inner wall of the first clamp, and has a bottomed cylindrical shape that includes a contact body in contact with an upper surface of the flange.

9. The substrate processing apparatus according to claim 3, wherein the lid is configured to close an opening of the second clamp.

10. The substrate processing apparatus according to claim 1, wherein the stage is formed of SiC, $Al_2O_3$, or AlN, and the low heat conductivity body is formed of quartz.

11. The substrate processing apparatus according to claim 9, wherein the lid is formed of SiC or C.

12. The substrate processing apparatus according to claim 3, further comprising:
   a pressing member including a disc spring, disposed on an inside bottom surface of the second clamp, and pressing a bottom of the second clamp toward a bottom of the first clamp.

13. The substrate processing apparatus according to claim 1, wherein the heater is spaced apart from the stage and the lid.

* * * * *